United States Patent [19]

Sherstinsky et al.

[11] Patent Number: 5,316,278
[45] Date of Patent: May 31, 1994

[54] CLAMPING RING APPARATUS FOR PROCESSING SEMICONDUCTOR WAFERS

[75] Inventors: Semyon Sherstinsky, San Francisco; Mei Chang, Cupertino; Charles C. Harris, Los Gatos; Alfred Mak, Union City; James F. Roberts, Campbell; Simon W. Tam, San Jose; Wen T. Chang, Mountain View, all of Calif.

[73] Assignee: Applied Materials, Inc., Santa Clara, Calif.

[21] Appl. No.: 947,212

[22] Filed: Sep. 18, 1992

[51] Int. Cl.⁵ .................................................. B25B 1/00
[52] U.S. Cl. ................................ 269/254 R; 269/288; 269/903
[58] Field of Search ............... 204/298.15; 269/903, 269/287, 288, 309, 254 R, 21; 279/141; 118/500, 503

[56] References Cited

U.S. PATENT DOCUMENTS

| | | | |
|---|---|---|---|
| 1,482,566 | 2/1924 | Keller | 279/141 |
| 3,927,955 | 8/1976 | Nevis et al. | 204/298.15 |
| 4,473,455 | 9/1984 | Dean et al. | 269/903 |
| 4,767,984 | 8/1988 | Bakker | 269/903 |
| 4,807,421 | 2/1989 | Araki et al. | 269/254 R |
| 5,037,262 | 8/1991 | Moll et al. | 204/298.15 |
| 5,203,981 | 4/1993 | Akazawa | 204/298.15 |

*Primary Examiner*—Robert C. Watson
*Attorney, Agent, or Firm*—John P. Taylor

[57] ABSTRACT

An improved clamping ring apparatus is disclosed comprising a clamping ring means for yieldably engaging a generally circular semiconductor wafer to peripherally clamp the wafer to a support pedestal to provide a peripheral seal between the wafer and the surface of the pedestal facing the wafer, adjacent the generally circular end edge of the wafer by providing a central generally circular opening in the clamping ring and a series of slots which radially extend outwardly from the central opening in the clamping ring means to thereby divide the inner portion of the clamping ring means into a series of yieldable fingers inwardly extending toward the central opening in the clamping ring means.

In one embodiment, the sidewalls of the slots are slanted with respect to the planar surface of the clamping ring means at an angle sufficient, with respect to the thickness of the clamping ring means and the width of the slot,, to prevent a ray or a particle from a plasma, traveling in a direction perpendicular to the plane of the surface of the clamping ring means from striking surfaces underlying the clamping ring means, through the slot.

15 Claims, 2 Drawing Sheets

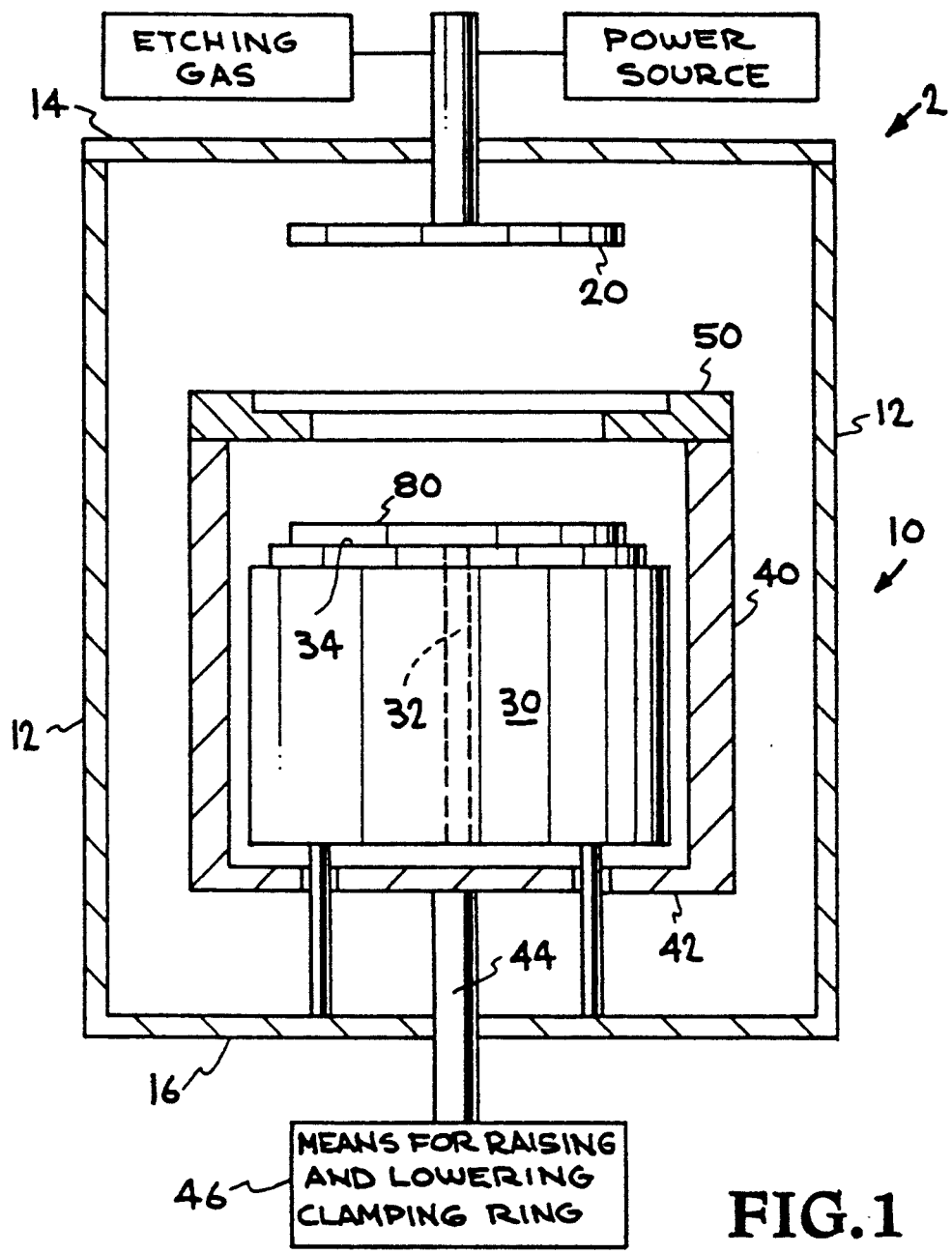
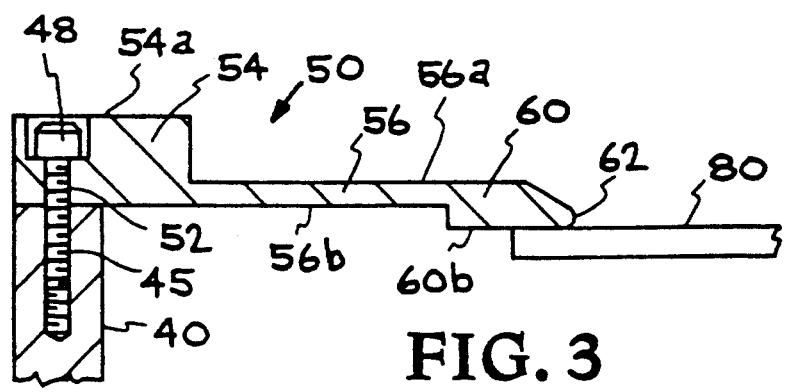

CLAMPING RING APPARATUS FOR PROCESSING SEMICONDUCTOR WAFERS

BACKGROUND OF THE INVENTION

1. Field of the Invention

This invention relates to apparatus for the processing of semiconductor wafers. More particularly, this invention relates to a clamping ring apparatus for yieldably engaging the upper surface of a semiconductor wafer peripherally adjacent the outer edge of the wafer to clamp the wafer to an underlying support pedestal.

2. Description of the Related Art

In the plasma etching of semiconductor wafers, it is conventional to cool the wafer (or more properly to maintain it at a preselected temperature) during the etch process by flowing a gas, e.g., helium or argon, through an opening in the underlying cathode support pedestal to the space between the top surface of the pedestal and the undersurface (backside) of the wafer. The presence of such a gas in this space serves t& enhance the thermal coupling of the wafer to the underlying pedestal which serves to cool the wafer, i.e., to maintain it at a preselected temperature despite heat generated by the plasma etching being carried out on the top surface of the wafer.

While the use of such a thermal coupling gas serves the intended purpose of cooling the wafer by thermally coupling it to the underlying pedestal (which, in turn, may be maintained at a preselected temperature by a heater or circulation of cooling fluid through the pedestal) to avoid excessive and therefore deleterious heat buildup during the etching process, escape of the thermal coupling gas into the etch chamber from the edges of the wafer/pedestal may interfere with the etch process by changing the makeup of the etch gases flowing into the chamber.

It is, therefore, customary to secure the wafer to the pedestal by a clamping ring actuated by a clamping mechanism which exerts the necessary force needed to clamp the wafer to the underlying pedestal. Such prior art clamping rings are usually either continuous rings which engage the periphery of the top surface of the wafer, i.e., adjacent the end edge of the circular wafer, or intermittent fingers which peripherally engage portions of the top surface of the wafer to urge it against the underlying pedestal.

The gas such as helium or argon supplied to the space between the backside of the wafer and the upper surface of the pedestal is supplied under pressure (relative to the pressure within the etch chamber) which serves to deflect or warp the thin wafer into a dome shape. It is not unusual for the underlying surface of the pedestal to therefore also be provided in such a dome shape to compensate for this expected behavior of the wafer, thereby providing even spacing between the backside surface of the wafer and the underlying pedestal.

However, this combination of thermal coupling gas pressure and wafer deflection also often results in an uneven surface interface between the wafer and the pedestal adjacent the end edge of the wafer, resulting in undesirable leaking of the helium or argon into the etch chamber, despite the use of a clamping ring or clamping fingers.

To avoid such leaks, it has become the customary practice to place an elastomer seal between the pedestal and the wafer. The seal complies with the wafer surface and more or less effectively reduces the leak.

However, there are certain drawbacks or penalties which accompany the use of an elastomer seal in a vacuum chamber,, including particle generation, plasma cleaning restrictions (the gases used may react with the elastomer), and temperature restrictions. The latter may not only be a problem with regard to etch process temperatures employed, but also due to the wafer temperature when it enters the etch chamber or zone. In integrated processing, the wafer may be at a temperature as high as 400° C. from prior processing. Placing such a hot wafer on an elastomer seal can result in many undesirable effects, not the least of which is partial melting of the seal, resulting in the wafer sticking to the pedestal.

It would, therefore, be desirable to provide apparatus for clamping a semiconductor wafer to an underlying pedestal in a manner which provides satisfactory peripheral sealing of the backside of the wafer, adjacent the end edge of the wafer, to the underlying pedestal, without the use of elastomeric sealing materials, to permit a thermal coupling gas to flow under pressure (with respect to the pressure in the etch chamber) into the space between the backside of the wafer and the underlying pedestal surface without any substantial escape of the gas into the etch chamber.

SUMMARY OF THE INVENTION

It is, therefore, an object of the invention to provide an improved clamping ring apparatus comprising a clamping ring means for yieldably engaging a generally circular semiconductor wafer to peripherally clamp the wafer to an underlying support pedestal to provide a peripheral seal between the backside of the wafer and the surface of the pedestal facing the wafer, adjacent the circular end edge of the wafer.

It is another object of the invention to provide an improved clamping ring apparatus, as described above, wherein the clamping ring means is further provided with a central generally circular opening whereby the clamping ring means will peripherally engage the upper surface of the wafer only adjacent the generally circular end edge of the wafer.

It is yet another object of the invention to provide an improved clamping ring apparatus, as described above, wherein the clamping ring means is further provided with a series of slots formed in the clamping ring means which radially extend outwardly from the central generally circular opening in the clamping ring means to thereby divide the portion of the clamping ring means peripherally engaging said first surface of the wafer into a series of yieldable fingers inwardly extending toward the generally circular central opening in the clamping ring means.

It is still another object of the invention to provide an improved clamping ring apparatus, as described above, wherein the sidewalls of the slots are slanted with respect to the generally planar surfaces of the clamping ring means at an angle sufficient, with respect to the thickness of the clamping ring means and the width of the slot, to prevent a ray or a particle from a plasma, traveling in a direction perpendicular to the plane of the surface of the generally clamping ring means from striking the surface of the underlying wafer, or other materials underlying the clamping ring means, through the slot.

These and other objects of the invention will be apparent from the following description and accompanying drawings.

BRIEF DESCRIPTION OF THE DRAWINGS

FIG. 1 is a vertical cross-sectional view of a general plasma etch apparatus utilizing the clamping ring means of the invention.

FIG. 3 is a side section view of one side of the clamping ring means of FIG. 2, taken along lines 3—3, and also showing how the clamping ring means is mounted to the mechanism used for raising and lowering the clamping ring means onto the wafer, and engagement of the wafer by the clamping ring means.

DETAILED DESCRIPTION OF THE INVENTION

Figure 2:
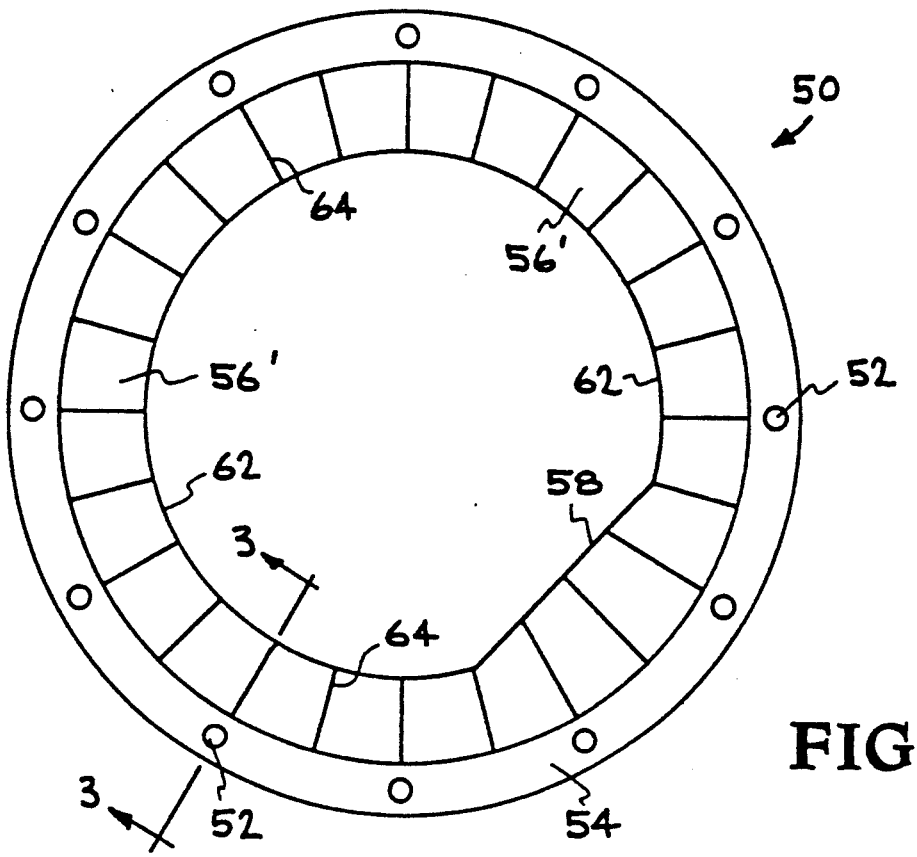
FIG. 2 is a top view of the clamping ring means.

Referring now to FIG. 1, a generalized plasma etching apparatus is generally indicated at 2 comprising a vacuum chamber 10 having sidewalls 12, a top wall 14, and a bottom wall 16. A showerhead 20 may serve as both the etching gas inlet, via connection to an external gas source (not shown); and as the anode for the plasma generation, through electrical connection to the power side of an external power source, (not shown), e.g., an RF power source.

A wafer 80 is shown mounted on a cylindrical supporting pedestal 30 which may also serve as the grounded cathode of the plasma power source. A gas passageway 32 within pedestal 30 serves to provide a thermal coupling gas from an external source (not shown) to the space 34 defined between the top surface of pedestal 30 and the backside of wafer 80 to thereby thermally couple wafer 80 to pedestal 30 which may be either heated or cooled by heating or cooling means (not shown). Due to the large thermal mass of pedestal 30, relative to the mass of wafer 80, thermal coupling of wafer 80 to pedestal 30 tends to dissipate heat generated in wafer 80 by the plasma etching process, whereby possible damage to the wafer by such heat is eliminated.

Surrounding the sides surfaces of cylindrical pedestal 30 is a cylindrical support 40 of sufficiently larger diameter than pedestal 3 0 so as to permit independent vertical movement of support 40 with respect to pedestal 30. Support 40 is used to support clamping ring means 50 of the invention, as will be described below. Support 40 has a bottom portion 42 attached to a vertical shaft 44 which is coupled to means 46 for raising and lowering support 40. Raising and lowering means 46, which forms no part of the present invention, may comprise a combination of fluid power means and spring means to bias support 40 in either a raised or lowered position, as desired, with the fluid power means then used to overcome the spring bias.

Secured to the upper end surface of cylindrical support 40 is circular clamping ring means 50 of the invention. Referring to FIGS. 2 and 3, clamping ring 50, which may have an outer diameter approximately that of the outer diameter of cylindrical support 40, maybe secured to support 40 via bolts 48, which pass through openings 52 spaced around the periphery of clamping ring means 50. Bolts 48 are received in threaded bores 45 in support 40, as best seen in FIG. 2, to secure clamping ring means 50 to cylindrical support 40.

Still referring to FIGS. 2 and 3, clamping ring means 50 comprises a circular disc-like member comprising a thicker outer portion 54, which may have a width of about 0.30", and which contains the series of openings 52 referred to above through which bolts 48 secure clamping ring means 50 to support 40.

Clamping ring means 50 is also provided with an inwardly extending thinned portion 56 which terminates in a thicker inner end portion 60 adjacent the inner edge 62 of clamping ring means 50. Thinned portion 56, which has a width, between thick outer portion 54 and thick inner end portion 60 ranging from about 5 mm to about 10 mm, provides a certain degree of flexure to the inner portion of clamping ring means 50, as will be described below. In this regard, the use of the term "thinned" with respect to the thickness of portion 56 of clamping ring means 50 refers to a thickness ranging from about 0.5 mm to about 0.8 mm, in comparison to a thickness of about 6 mm for portion 54 and about 1.5 mm for portion 60. While disc-like clamping ring means 50 thus is provided with several surfaces thereon of varying heights, the top surface 54a of the thick outer portion 54 of clamping ring means 50, the top surface 56a and bottom surface 56b of thinned portion 54, and the bottom surface 60b of inner end portion 60, which will engage wafer 80, are all generally parallel to one another and may all be described as lying in planes parallel to the plane of disc-like clamping ring means 50.

Clamping ring means 50 is provided with a central opening, defined by inner edge 62, which is generally circular, to provide an ID just slightly smaller than the OD of wafer 80 so that only a small portion of the top surface of wafer 80, adjacent the outer end edge of wafer 80, is engaged by undersurface 60b of clamping ring means 50. For example, for a 200 millimeter (mm) wafer, the ID of clamping ring 50 will range from about 194 mm to 197 mm, providing an engagement of from about 1.5 mm to about 3 mm of the top surface of the wafer. Central opening or inner edge 62 of clamping ring means 50 will usually have an ID ranging from about 2 mm to 10 mm smaller than the OD of the circular wafer. Preferably the ID of the central opening will range from about 3 mm to about 6 mm smaller than the OD of the wafer.

It should be noted that the inner opening in clamping ring 50 defined by edge 62 is described as "generally circular" in recognition of the flat portion of the inner opening depicted at 58 in FIG. 2 which matches the orientation flat conventionally provided on semiconductor wafers. Because of this orientation flat on the wafer, semiconductor wafers to be engaged by clamping ring 50 in accordance with the invention will also be referred to herein as "generally circular".

Figure 4:
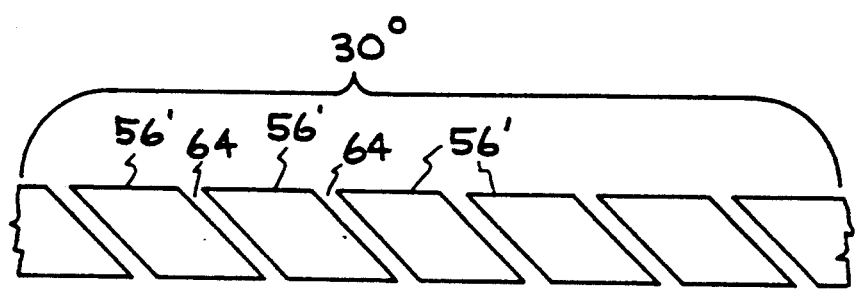
FIG. 4 is a fragmentary vertical section view of an angular portion of the inner circular opening in the clamping ring means of FIG. 2 laid out flat to show the slanted slots separating the individual fingers of the clamping ring means.
Figure 5:
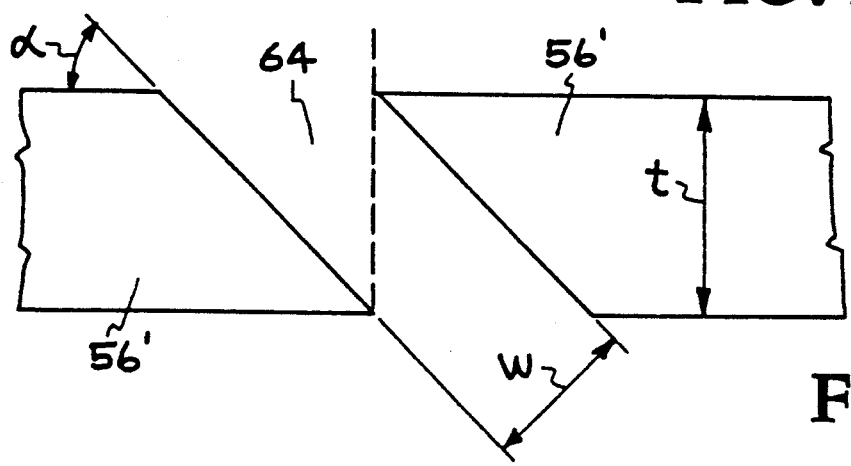
FIG. 5 is a an enlarged fragmentary vertical section view of a portion of FIG. 4 enlarged to show the relationship of the thickness of the clamping ring means, the width of the slots, and the angle of the slots to the surface plane of the clamping ring means to ensure that the plasma cannot directly reach the wafer surface or other materials below the clamping ring means through the slot.

As best seen in FIG. 2, a series of radial slots or cuts 64 are formed in thinned portion 56 of clamping ring means 50 and thick inner portion 60 which extend through clamping ring means 50 from upper surface 56a to lower surfaces 56b and 60b. Slots 64 outwardly terminate at the point where thick portion 54 of clamping ring means 50 commences, and terminate inwardly at inner edge 62, i.e., at the central opening in clamping ring means 50, thereby dividing thinned portion 56 into a series of fingers 56', as shown in FIGS. 2, 4, and 5. Since the distance from inner edge 62 of clamping ring means 50 to where thick portion 54 commences ranges from about 5 mm to about 10 mm, the length of each finger 56' will likewise range from about 5 mm to about 10 mm.

The thinning of clamping ring means 50 at 56, coupled with the provision of slots 64 results in the formation of a plurality of yieldable or spring-like fingers 56' which will provide a yieldable peripheral force which is exerted on the upper surface of the wafer adjacent the circular outer end edge of the wafer when the clamping ring is lowered into contact with the wafer. When thinned portion 56 is constructed to have a thickness, from top surface 56a to bottom surface 56b, ranging from about 0.06" to about 0.08, the end portion 60 of each of the fingers 56' formed by slots 64 may independently flex as much as 0.005" from the plane in which bottom surface 60b normally lies.

While the illustration shown in FIG. 2 shows only a limited number of such fingers 56' created by slots 64 to avoid crowding of the drawing, it will be appreciated that many more such slots and fingers may be (and preferable are) created to provide a plurality of closely spaced apart independent pressure points on the wafer to more closely simulate the elastomeric seal means being replaced. As an example, for a 200 mm wafer, clamping ring means 50 is preferably provided with as many as 72 such fingers 56'.

This provision of a series of independent fingers on clamping ring means 50, each capable of independently flexing, in essence provides an adjustable force around the entire periphery of wafer 80 which can compensate for warpage or other non-flat surface portions around the backside of the wafer adjacent the outer end edge of wafer 80 in a manner equivalent to, but essentially better than, the prior art elastomeric sealing members previously utilized to seal the edge of the backside of the wafer to the underlying pedestal.

In this respect it will be readily appreciate that while it is known in the prior art to use several fingers to clamp a wafer to a pedestal, the fingers referred to herein are different in that except for the width of the slots themselves (which are quite small), essentially all of the inner circumference of clamping ring means 50 is in contact with the front surface of the wafer. Thus, even relatively small differences in height of the wafer at various points on the pedestal may be compensated for by contact with an individual finger to assure a snug (and gastight) fit between the backside of the wafer and the pedestal surface.

The thickness or width of the slot, as measured at a right angle to the surface of the slot, and shown as width "w" in FIG. 5, may vary from about 0.016" to about 0.030", depending at least in part, on the thickness of the cutting blade used to form the slot.

In a preferred embodiment, radial slots 64 are not cut perpendicular to the plane of the surface of clamping ring means 50, but are rather slanted, as shown in FIGS. 4 and 5, so that ions or other charged particles from the plasma which impinge perpendicularly on clamping ring means 50 will not pass through slots 64 to impinge on the materials, e.g., the wafer, which lie below clamping ring means 50.

The angle $\alpha$ of the slant of slots 64, with respect to the plane of clamping ring 50, e.g., with respect to surfaces 56a or 56b, may be varied, depending upon the width "w" of slot 64 and the thickness "t" of thin portion 56, to provide the desired shielding of the underlying surfaces from exposure to the plasma. As can be seen by referring to FIG. 5, as the thickness t increases, angle a may be increased without risk of exposure for any given slot width. Conversely, as the width w of slot 64 is increased, angle $\alpha$ must be decreased to provide the same desired degree of shielding.

Therefore, this relationship of thickness t of portion 56 of clamping ring means 50 and width w of slot 64 to angle $\alpha$ which the slot wall defines with the planar surfaces of clamping ring means 50 (e.g., surface 56a) to define a slot in which the surface beneath clamping ring means 50 is shielded from the plasma may be expressed as follows: The maximum angle $\alpha$ which the wall of slot 64 defines with the plane of clamping ring 50 is that angle whose cosine is less than w/t, where w is the width of slot 64 and t is the thickness of portion 56 of clamping ring 50.

In operation then, a wafer 80 is placed on pedestal 30 and clamping ring means 50 and support cylinder 40 are lowered, via mechanism 46 until undersurfaces 60b of fingers 56' on clamping ring means 50 contact the outer end edge of the upper surface of wafer 80. Clamping ring means 50 is then further lowered to cause a slight flexing of fingers 56' as the various fingers make contact with the periphery of wafer 80, thus forming a seal between the backside of wafer 80 and the top surface of pedestal 40 around the entire periphery of wafer 80. A thermally conductive gas such as helium or argon can than be flowed, via passage 32, to space 34 between the backside of wafer 80 and the top surface of pedestal 30 to thermally couple wafer 80 to pedestal 30.

The amount of force exerted on wafer 80 may be varied by varying the downward force applied by lowering means 46 on support 40 and clamping ring means 50. For example, when the upward force comprises a fluid power means opposing a spring bias which acts to lower support 40 and clamping ring means 50, the spring bias may be suitably adjusted. The total force exerted by clamping ring means 50 on wafer 80 should be less than the force needed to cause any of the individual fingers 56' to flex more than about 0.25 mm with respect to the plane of clamping ring means 50 to avoid risk of damage to the fingers.

Thus, the invention provides an improved clamping ring means wherein the backside surface of a wafer may be sealed to the top surface of an underlying pedestal in a manner sufficiently effective to permit elimination of an elastomeric seal between the wafer backside surface and the top surface of the support pedestal and to effectively isolate, from the chamber, thermally conductive gas admitted to the space between the backside of the wafer and the top surface of the underlying support pedestal.

Having thus described the invention what is claimed is:

1. In a semiconductor wafer processing apparatus comprising a wafer support pedestal adapted to support a generally circular semiconductor wafer thereon during processing of said wafer in said apparatus, the improvement which comprises a clamping ring apparatus for yieldably engaging said generally circular semiconductor wafer to peripherally clamp said wafer to said support pedestal to provide a peripheral seal between said wafer and the surface of said pedestal facing said wafer, adjacent the circular end edge of said wafer which comprises a clamping ring means with yieldable finger means for providing a spring bias against the upper surface of said wafer peripherally adjacent said circular end edge of said wafer to peripherally seal said wafer to said pedestal.

2. The clamping ring apparatus of claim 1 wherein said clamping ring means is provided with a central circular opening having a diameter smaller than the diameter of said wafer whereby said yieldable means of said clamping ring means will peripherally engage only an outer portion of said upper surface of said wafer adjacent said circular end edge of said wafer.

3. The clamping ring apparatus of claim 2 wherein a series of slots are formed in said clamping ring means which radially extend outwardly from said central circular opening in said clamping ring means to thereby divide the portion of said clamping ring means peripherally engaging said first surface of said wafer into a series of yieldable fingers comprising said yieldable means which extend inwardly toward said circular central opening in said clamping ring means.

4. A clamping ring apparatus for yieldably engaging the upper surface of a circular semiconductor wafer to peripherally clamp said wafer to a support pedestal to provide a peripheral seal between the backside surface of said wafer and the surface of said pedestal facing said wafer, adjacent the circular end edge of said wafer, which comprises a disc-like clamping ring means having a central circular opening of a diameter smaller than the diameter of said wafer, and a series of slots formed in said clamping ring means which radially extend outwardly from said central circular opening in said clamping ring means to thereby divide the portion of said clamping ring means peripherally engaging said first surface of said wafer into a series of yieldable fingers inwardly extending toward said circular central opening in said clamping ring means to provide a yieldable spring bias exerted against an outer portion of said first surface of said wafer adjacent said circular end edge of said wafer, said sidewalls of said slots slanted, with respect to the planar surface of said clamping ring means, at an angel sufficient, with respect to the thickness of said clamping ring means and the width of said slot, to prevent a plasma, traveling in a direction perpendicular to a planar surface of said clamping ring means, from striking surfaces beneath said clamping ring means through said slot.

5. The clamping ring apparatus of claim 4 wherein said slots between said fingers formed from said clamping ring means range in width from about 0.016" to about 0.03".

6. The clamping ring apparatus of claim 5 wherein each of said fingers ranges in length from about 5 mm to about 10 mm.

7. The clamping ring apparatus of claim 4 wherein the angle $\alpha$ of said slanted wall of said slot, with respect to said planar surface of said clamping ring means, is <the value of a when $\cos \alpha = w/t$, where w is the width of said slot measured from one wall of said slot to the opposite wall, and t is the thickness of the portion of said clamping ring means where said slot is formed.

8. The clamping ring apparatus of claim 6 wherein said clamping ring means consists essentially of a metallic disc.

9. The clamping ring apparatus of claim 8 wherein said clamping ring means has a thin portion where said fingers are formed having a thickness ranging from about 0.5 mm to about 0.8 mm.

10. A clamping ring apparatus for yieldably engaging the upper surface of a generally circular semiconductor wafer to peripherally clamp said wafer to a support pedestal to provide a peripheral seal between the backside surface of said wafer and the surface of said pedestal facing said wafer, adjacent the circular end edge of said wafer which comprises:
a) a disc-like clamping ring means having a central generally circular opening of a diameter smaller than the diameter of said wafer;
b) a wafer support pedestal having a planar surface capable of engaging said backside surface of said semiconductor wafer;
c) a series of slots formed in said clamping ring means which radially extend outwardly from said central circular opening in said clamping ring means, to thereby divide the portion of said clamping ring means peripherally engaging said front surface of said wafer into a series of yieldable fingers inwardly extending toward said circular central opening in said clamping ring means to provide a yieldable spring bias exerted against an outer portion of said front surface of said wafer adjacent said circular end edge of said wafer, whereby said clamping ring means yieldably seals the periphery of the backside of said wafer to said pedestal.

11. The clamping ring apparatus of claim 6 wherein said circular central opening has a diameter ranging from about 2 mm to about 10 mm less than the outer diameter of said wafer.

12. The clamping ring apparatus of claim 6 wherein said circular central opening has a diameter ranging from about 3 mm to about 6 mm less than the outer diameter of said wafer.

13. The clamping ring apparatus of claim 10 wherein the sidewalls of said slots are slanted with respect to the planar surface of said clamping ring means at an angle sufficient, with respect to the thickness of said clamping ring means and the width of said slot, to prevent a plasma, traveling in a direction perpendicular to a planar surface of said clamping ring means from striking surfaces beneath said clamping ring means through said slot.

14. The clamping ring apparatus of claim 13 wherein the angle $\alpha$ of said slanted wall of said slot, with respect to said planar surface of said clamping ring means, is <the value of a when $\cos \alpha = w/t$, where w is the width of said slot measured from one wall of said slot to the opposite wall, and t is the thickness of the portion of said clamping ring means where said slot is formed.

15. A clamping ring apparatus for yieldably engaging a generally circular semiconductor wafer to peripherally clamp said wafer to a support pedestal to provide a peripheral seal between said wafer and the surface of said pedestal facing said wafer, adjacent the circular end edge of said wafer, which comprises:
a) clamping ring means provided with a generally circular central opening having a diameter smaller than the diameter of said wafer;
b) means for yieldably engaging the upper surface of said wafer peripherally adjacent said circular end edge of said wafer comprising a series of slots formed in said clamping ring means which radially extend outwardly from said central circular opening in said clamping ring means to thereby divide the portion of said clamping ring means peripherally engaging said first surface of said wafer into a series of yieldable fingers inwardly extending toward said circular central opening in said clamping ring means to provide a yieldable spring bias exerted against an outer portion of said first surface of said wafer adjacent said circular end edge of said wafer; and c) slanted sidewalls on said slots wherein the angle $\alpha$ of said slanted sidewall of said slot, with respect to said planar surface of said clamping ring means, is < the value of $\alpha$ when $\cos \alpha = w/t$, where w is the width of said slot measured from one wall of said slot to the opposite wall, and t is the thickness of the portion of said clamping ring means where said slot is formed.

* * * * *